US010559520B2

(12) United States Patent
Goktepeli et al.

(10) Patent No.: US 10,559,520 B2
(45) Date of Patent: Feb. 11, 2020

(54) BULK LAYER TRANSFER PROCESSING WITH BACKSIDE SILICIDATION

(71) Applicant: QUALCOMM Incorporated, San Diego, CA (US)

(72) Inventors: Sinan Goktepeli, San Diego, CA (US); George Pete Imthurn, San Diego, CA (US); Stephen Alan Fanelli, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/975,434

(22) Filed: May 9, 2018

(65) Prior Publication Data
US 2019/0103339 A1     Apr. 4, 2019

Related U.S. Application Data

(60) Provisional application No. 62/565,495, filed on Sep. 29, 2017.

(51) Int. Cl.
| H01L 23/48 | (2006.01) |
| H01L 21/762 | (2006.01) |
| H01L 23/522 | (2006.01) |
| H01L 21/768 | (2006.01) |
| H01L 21/8234 | (2006.01) |
| H01L 25/065 | (2006.01) |
| H01L 25/11 | (2006.01) |
| H01L 49/02 | (2006.01) |

(52) U.S. Cl.
CPC ...... *H01L 23/481* (2013.01); *H01L 21/76229* (2013.01); *H01L 21/76898* (2013.01); *H01L 21/823475* (2013.01); *H01L 21/823481* (2013.01); *H01L 23/522* (2013.01); *H01L 25/0657* (2013.01); *H01L 25/117* (2013.01); *H01L 28/10* (2013.01); *H01L 28/40* (2013.01)

(58) Field of Classification Search
CPC ............ H01L 23/481; H01L 21/76229; H01L 23/522; H01L 28/40; H01L 21/823475; H01L 25/0657
See application file for complete search history.

(56) References Cited

U.S. PATENT DOCUMENTS 4,882,296 A * 11/1989 Hoheisel ............... H01L 21/321
                                                                    438/96
7,705,455 B2    4/2010 Miyakawa et al.
(Continued)

OTHER PUBLICATIONS

International Search Report and Written Opinion—PCT/US2018/048125—ISA/EPO—dated Dec. 14, 2018.

*Primary Examiner* — Charles D Garber
*Assistant Examiner* — S M Sohel Imtiaz
(74) *Attorney, Agent, or Firm* — Seyfarth Shaw LLP

(57) ABSTRACT

A radio frequency integrated circuit (RFIC) includes a bulk semiconductor die. The RFIC also includes a first active/passive device on a first-side of the bulk semiconductor die, and a first deep trench isolation region extending from the first-side to a second-side opposite the first-side of the bulk semiconductor die. The RFIC also includes a contact layer on the second-side of the bulk semiconductor die. The RFIC further includes a second-side dielectric layer on the contact layer. The first deep trench isolation region may extend through the contact layer and into the second-side dielectric layer.

10 Claims, 14 Drawing Sheets

(56) References Cited

U.S. PATENT DOCUMENTS

| | | |
|---|---|---|
| 7,960,245 B2 | 6/2011 | Bernstein et al. |
| 8,822,337 B2 | 9/2014 | Zhu |
| 9,711,502 B2 | 7/2017 | Huang et al. |
| 9,755,029 B1 | 9/2017 | Goktepeli et al. |
| 2009/0236607 A1* | 9/2009 | Miyazaki .......... H01L 23/53223 257/72 |
| 2010/0099357 A1* | 4/2010 | Liu ...................... H01L 23/481 455/41.2 |
| 2012/0091593 A1* | 4/2012 | Cheng .................. H01L 21/743 257/774 |
| 2013/0249011 A1* | 9/2013 | Choi ..................... H01L 23/481 257/369 |
| 2015/0084194 A1* | 3/2015 | Molzer ................. H01L 23/481 257/741 |
| 2015/0348870 A1* | 12/2015 | Feilchenfeld ......... H01L 21/743 257/506 |
| 2016/0163583 A1* | 6/2016 | Liu .................. H01L 21/76229 257/401 |
| 2016/0379936 A1* | 12/2016 | Spitzlsperger .... H01L 21/76898 257/139 |
| 2017/0053907 A1* | 2/2017 | Huang .............. H01L 21/76251 |
| 2017/0092669 A1* | 3/2017 | Jerome .............. H01L 27/1463 |
| 2018/0138081 A1* | 5/2018 | Wu .................. H01L 21/76283 |

\* cited by examiner

BULK LAYER TRANSFER PROCESSING WITH BACKSIDE SILICIDATION

CROSS-REFERENCE TO RELATED APPLICATION

This application claims the benefit of U.S. Provisional Patent Application No. 62/565,495, filed on Sep. 29, 2017, entitled "BULK LAYER TRANSFER PROCESSING WITH BACKSIDE SILICIDATION," the disclosure of which is expressly incorporated by reference herein in its entirety.

TECHNICAL FIELD

The present disclosure generally relates to integrated circuits (ICs). More specifically, the present disclosure relates to bulk layer transfer processing with backside silicidation.

BACKGROUND

Designing mobile radio frequency (RF) chips (e.g., mobile RF transceivers) is complicated by added circuit functions for supporting communication enhancements. Designing these mobile RF transceivers may include using semiconductor on insulator technology. Semiconductor on insulator (SOI) technology replaces conventional semiconductor (e.g., silicon) substrates with a layered semiconductor-insulator-semiconductor substrate for reducing parasitic capacitance and improving performance. SOI-based devices differ from conventional, silicon-built devices because a silicon junction is above an electrical isolator, typically a buried oxide (BOX) layer. A reduced thickness BOX layer, however, may not sufficiently reduce artificial harmonics caused by the proximity of an active device on the SOI layer and an SOI substrate supporting the BOX layer.

For example, high performance complementary metal oxide semiconductor (CMOS) radio frequency (RF) switch technologies are currently manufactured using SOI substrates. While SOI substrates may provide some protection against artificial harmonics in mobile RF transceivers, SOI substrates are very expensive. Furthermore, increasing device isolation and reducing RF loss may involve expensive handle wafers. For example, a CMOS switch device may be physically bonded to a high resistivity (HR) handle wafer, such as HR-silicon or sapphire. While the increased spatial separation of the switch device from the underlying substrate dramatically improves the RF performance of the CMOS switch, using HR-silicon or sapphire handle wafer dramatically drives up cost. That is, using SOI wafers and handle substrates is quite expensive relative to the cost of a bulk semiconductor wafer.

SUMMARY

A radio frequency integrated circuit (RFIC) may include a bulk semiconductor die. The RFIC may include a first active/passive device on a first-side of the bulk semiconductor die, and a first deep trench isolation region extending from the first-side to a second-side opposite the first-side of the bulk semiconductor die. The RFIC may also include a contact layer on the second-side of the bulk semiconductor die. The RFIC may further include a second-side dielectric layer on the contact layer. The first deep trench isolation region may extend through the contact layer and into the second-side dielectric layer.

A method of constructing a radio frequency (RF) integrated circuit may include fabricating a first transistor on a first-side of a bulk semiconductor wafer. The method may also include forming a first deep trench isolation region in the bulk semiconductor wafer, proximate the first transistor. The method may also include depositing a first-side dielectric layer on the first transistor. The method may further include bonding a handle substrate to the first-side dielectric layer. The method may also include exposing the first deep trench isolation region at a second-side of the bulk semiconductor wafer. The method may further include depositing a contact layer on the second-side of the bulk semiconductor wafer and on exposed sidewalls of the first deep trench isolation region.

A radio frequency (RF) front end module may include a wireless transceiver. The wireless transceiver may include a bulk semiconductor die including a first transistor on a first-side of the bulk semiconductor die, and a first deep trench isolation region extending from the first-side to a second-side opposite the first-side of the bulk semiconductor die. The wireless transceiver may also include a contact layer on the second-side of the bulk semiconductor die, and a second-side dielectric layer on the contact layer. The first deep trench isolation region may extend through the contact layer and into the second-side dielectric layer. The RF front end module may also include an antenna coupled to an output of the wireless transceiver.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
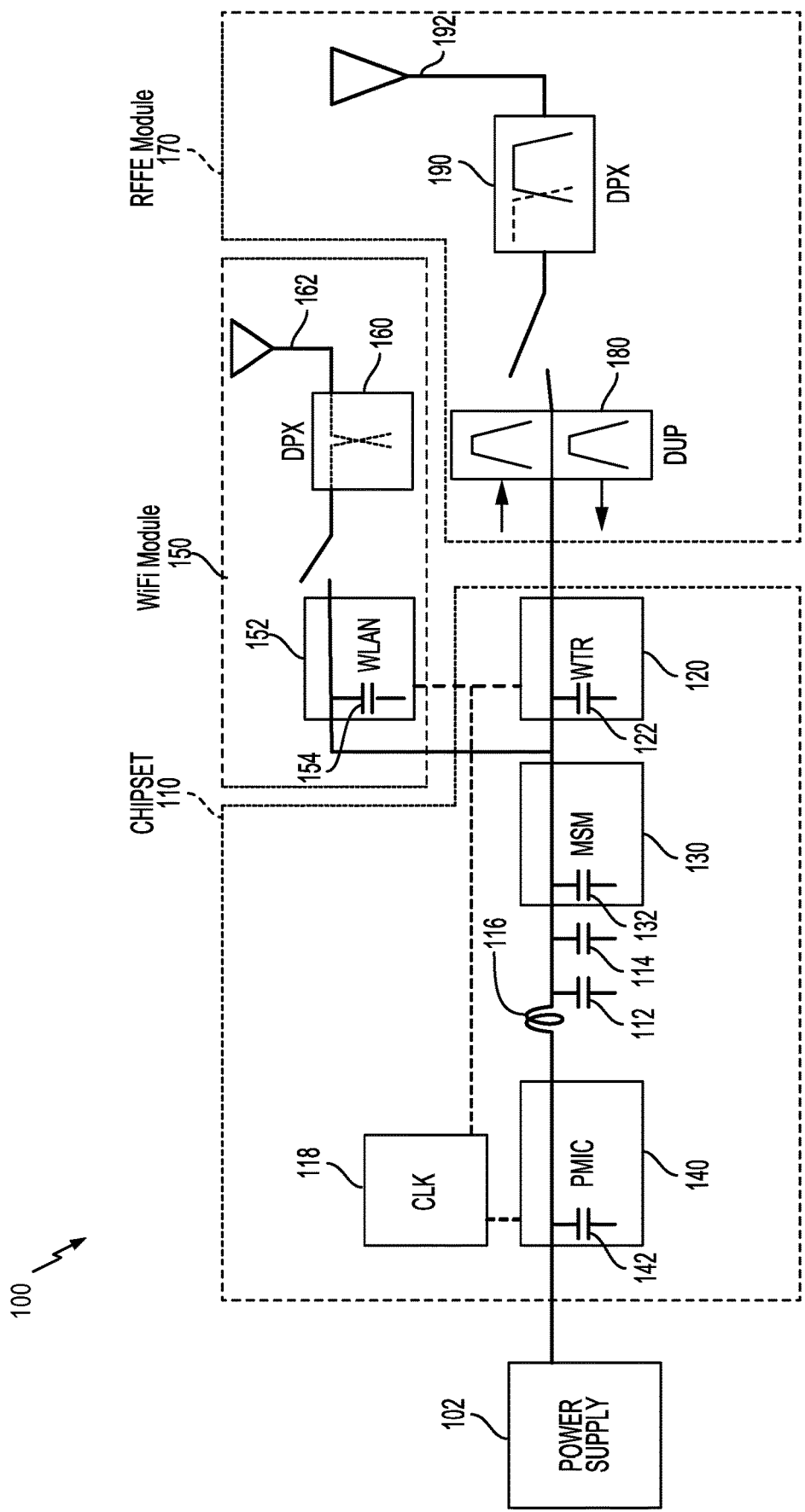
FIG. 1 is a schematic diagram of a wireless device having a wireless local area network module and a radio frequency (RF) front end module for a chipset.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Designing mobile radio frequency (RF) transceivers may include using semiconductor on insulator technology. Semiconductor on insulator (SOI) technology replaces conventional silicon substrates with a layered semiconductor-insulator-semiconductor substrate for reducing parasitic capacitance and improving performance. While SOI-based devices differ from conventional, silicon-built devices by including a silicon junction above an electrical isolator, typically a buried oxide (BOX) layer, SOI-based devices are more expensive than conventional, silicon-built devices. Furthermore, a reduced thickness BOX layer may not sufficiently reduce artificial harmonics caused by the proximity of an active device on an SOI layer and an SOI substrate supporting the BOX layer.

The active devices on the SOI layer may include high performance complementary metal oxide semiconductor (CMOS) transistors. For example, high performance CMOS RF switch technologies are currently manufactured using SOI substrates. A radio frequency front end (RFFE) module may rely on these high performances CMOS RF switch technologies for successful operation. A process for fabricating an RFFE module, therefore, involves the costly integration of an SOI wafer for supporting these high performances CMOS RF switch technologies. Furthermore, supporting future RF performance enhancements involves increasing device isolation while reducing RF loss.

One technique for increasing device isolation and reducing RF loss is fabricating an RFFE module using SOI wafers having trap rich regions. For example, an RF device (e.g., an RF switch device) may be fabricated using an SOI wafer having a trap rich region. Unfortunately, SOI wafers with trap rich regions cost about twice as much as regular SOI wafers. Alternatively, a layer transfer process may physically bond an RF switch device (e.g., fabricated using an SOI wafer) to a high resistivity (HR) handle wafer (e.g., such as HR-silicon or sapphire). The increased spatial separation, due to numerous layers of insulating dielectric, isolates the RF switch device from the underlying substrate, which dramatically improves the RF performance of the RF switch device. Unfortunately, using a HR handle wafer including, for example, a HR-silicon or sapphire wafer, is quite expensive relative to the cost of a bulk semiconductor wafer.

Various aspects of the present disclosure provide techniques for bulk layer transfer processing with backside silicidation. The process flow for semiconductor fabrication of the integrated RF circuit may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably.

Aspects of the present disclosure include using a bulk semiconductor (e.g., silicon) wafer for replacing SOI wafers. That is, aspects of the present disclosure employ inexpensive bulk semiconductor wafers for forming a semiconductor device layer without using an expensive SOI wafer. According to this aspect of the present disclosure, a radio frequency integrated circuit (RFIC) includes a semiconductor device layer on a front-side of a bulk semiconductor die. A deep trench isolation region may extend from the front-side to a backside opposite the front-side of the bulk semiconductor die.

A silicide layer may be deposited on the backside of the bulk semiconductor die as a contact layer. In addition, the back side of the bulk semiconductor die may be supported by a backside dielectric layer (e.g., a second-side dielectric layer) distal from a front-side dielectric layer (e.g., a first-side dielectric layer) on the semiconductor device layer. The RFIC may also include a handle substrate on the front-side dielectric layer. The front-side and backside may each be referred to as a first-side or a second-side. In some cases, the front-side will be referred to as the first-side. In other cases, the backside will be referred to as the first-side.

FIG. 1 is a schematic diagram of a wireless device (e.g., a cellular phone or a smartphone) having a wireless local area network module and a radio frequency (RF) front end module for a chipset. The wireless device 100 may include a wireless local area network (WLAN) (e.g., WiFi) module 150 and an RF front end module 170 for a chipset 110, which may be fabricated using a bulk semiconductor die, according to aspects of the present disclosure. The WiFi module 150 includes a first diplexer 160 communicably coupling an antenna 162 to a wireless local area network module (e.g., WLAN module 152). The RF front end module 170 includes a second diplexer 190 communicably coupling an antenna 192 to the wireless transceiver 120 (WTR) through a duplexer 180 (DUP).

The wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

The wireless transceiver 120 of the wireless device 100 generally includes a mobile RF transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal using a power amplifier (PA) to obtain an amplified RF signal having the proper output power level, and transmit the amplified RF signal via the antenna 192 to a base station. For data reception, the receive section may obtain a received RF signal via the antenna 192 and may amplify the received RF signal using a low noise amplifier (LNA) and process the received RF signal to recover data sent by the base station in a communication signal.

The wireless transceiver 120 may include one or more circuits for amplifying these communication signals. The amplifier circuits (e.g., LNA/PA) may include one or more amplifier stages that may have one or more driver stages and one or more amplifier output stages. Each of the amplifier stages includes one or more transistors configured in various ways to amplify the communication signals. Various options exist for fabricating the transistors that are configured to amplify the communication signals transmitted and received by the wireless transceiver 120.

Figure 2:
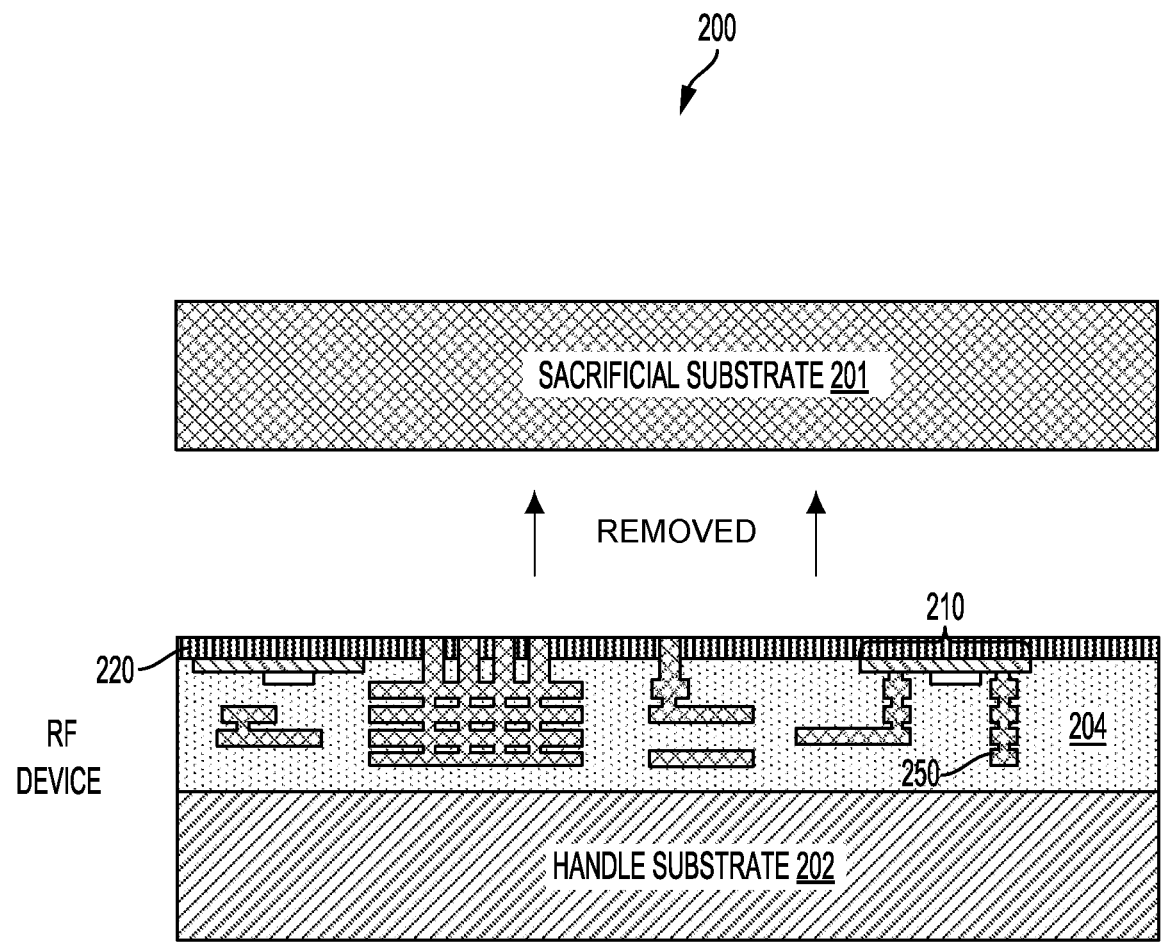
FIG. 2 shows a cross-sectional view of a radio frequency integrated circuit (RFIC), including an RF semiconductor on insulator (SOI) device.

The wireless transceiver 120 and the RF front end module 170 may be implemented using a layer transfer process to separate the active device from a substrate as shown in FIG. 2.

FIG. 2 shows a cross-sectional view of a radio frequency (RF) integrated circuit 200, including an RF semiconductor on insulator (SOI) device, which may be fabricated using a layer transfer process. As shown in FIG. 2, an RF device includes an active device 210 on an insulator layer 220, which is initially supported by a sacrificial substrate 201. The RF device also includes interconnects 250 coupled to the active device 210 within a first dielectric layer 204. In the layer transfer process, a handle substrate 202 is bonded to the first dielectric layer 204 of the RF device for enabling removal of the sacrificial substrate 201. Removal of the sacrificial substrate 201 using the layer transfer process enables high-performance, low-parasitic RF devices by increasing the dielectric thickness of, for example, the first dielectric layer 204. That is, a parasitic capacitance of the RF device is proportional to the dielectric thickness, which determines the distance between the active device 210 and the handle substrate 202.

The active device 210 on the BOX layer 220 may be a complementary metal oxide semiconductor (CMOS) transistor. The RFFE module 170 (FIG. 1) may rely on these high performance CMOS RF technologies for successful operation.

Figure 3:
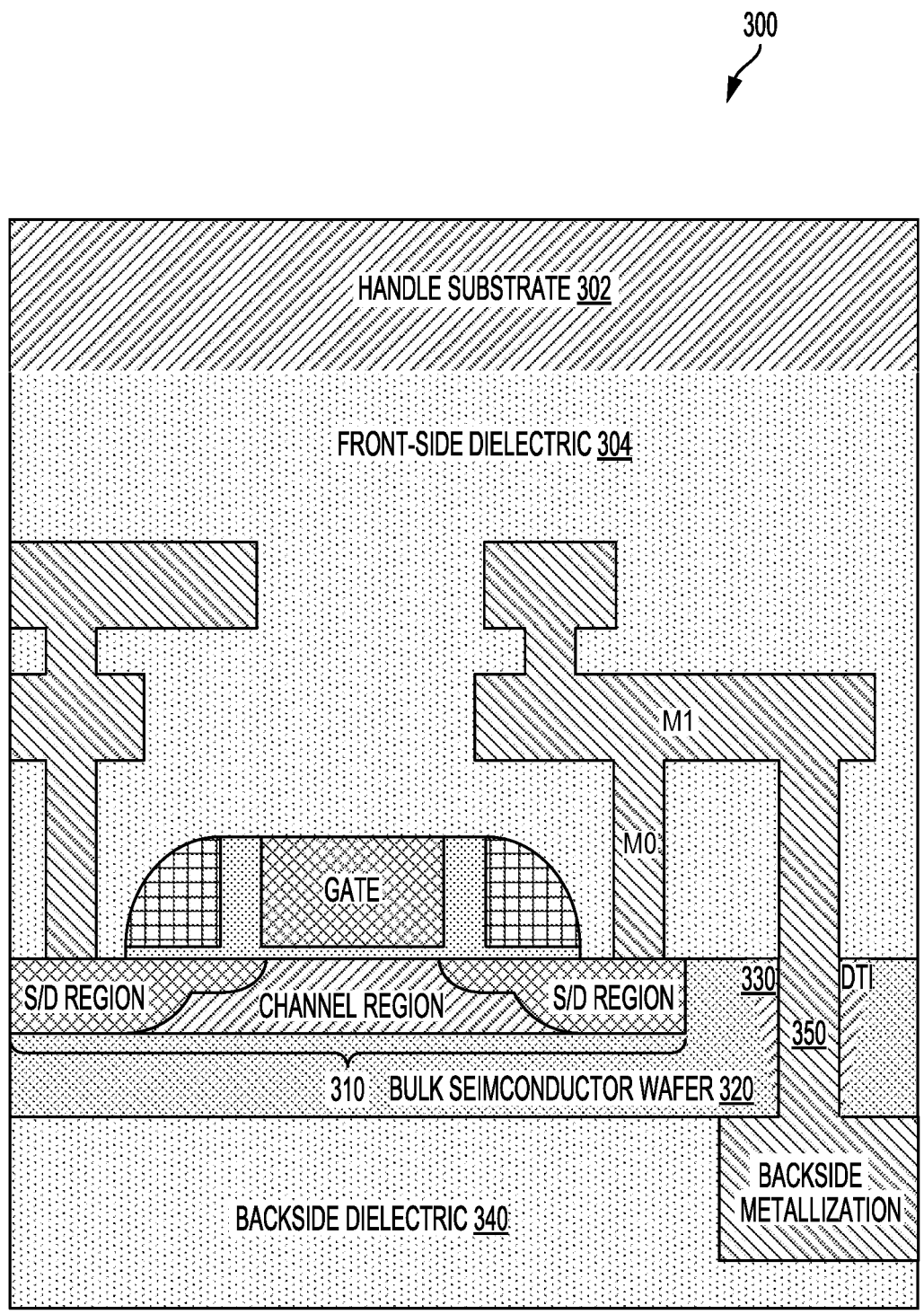
FIG. 3 is a cross-sectional view of a radio frequency integrated circuit (RFIC) fabricated using a bulk semiconductor layer transfer process according to aspects of the present disclosure.

FIG. 3 is a cross-sectional view of a radio frequency integrated circuit (RFIC) fabricated using a bulk semiconductor layer transfer process according to aspects of the present disclosure. Representatively, an RF integrated circuit 300 includes an active device 310 having a gate, source/drain (S/D) regions, and a channel region between the source/drain regions, each formed on a front-side of a bulk semiconductor wafer 320. In contrast to SOI implementations, an active device layer including the source/drain and channel regions is not supported by a buried oxide (BOX) layer. Although shown as an active device, it should be recognized that the active device 310 may be a first active/passive device, as well as a second active/passive device.

The RF integrated circuit 300 also includes middle-of-line (MOL)/back-end-of-line (BEOL) interconnects coupled to the source/drain regions of the active device 310. As described, the MOL/BEOL layers may be referred to as first-side (e.g., front-side) layers. By contrast, the layers supporting the bulk semiconductor wafer 320 may be referred to as second-side (e.g., backside) layers. In this example, a front-side metallization layer M1 is coupled to the source/drain regions of the active device 310 and arranged in a front-side dielectric layer 304. In addition, a handle substrate 302 is coupled to the front-side dielectric layer 304. A backside dielectric 340 is adjacent to and possibly supports the bulk semiconductor wafer 320. In addition, a backside metallization layer (e.g., a second-side metallization layer) is coupled to the front-side metallization layer M1 with a trench interconnect 350 through a deep trench isolation (DTI) region 330 extending from the front-side to the backside of the bulk semiconductor wafer 320, as further illustrated in FIG. 4.

Figure 4:
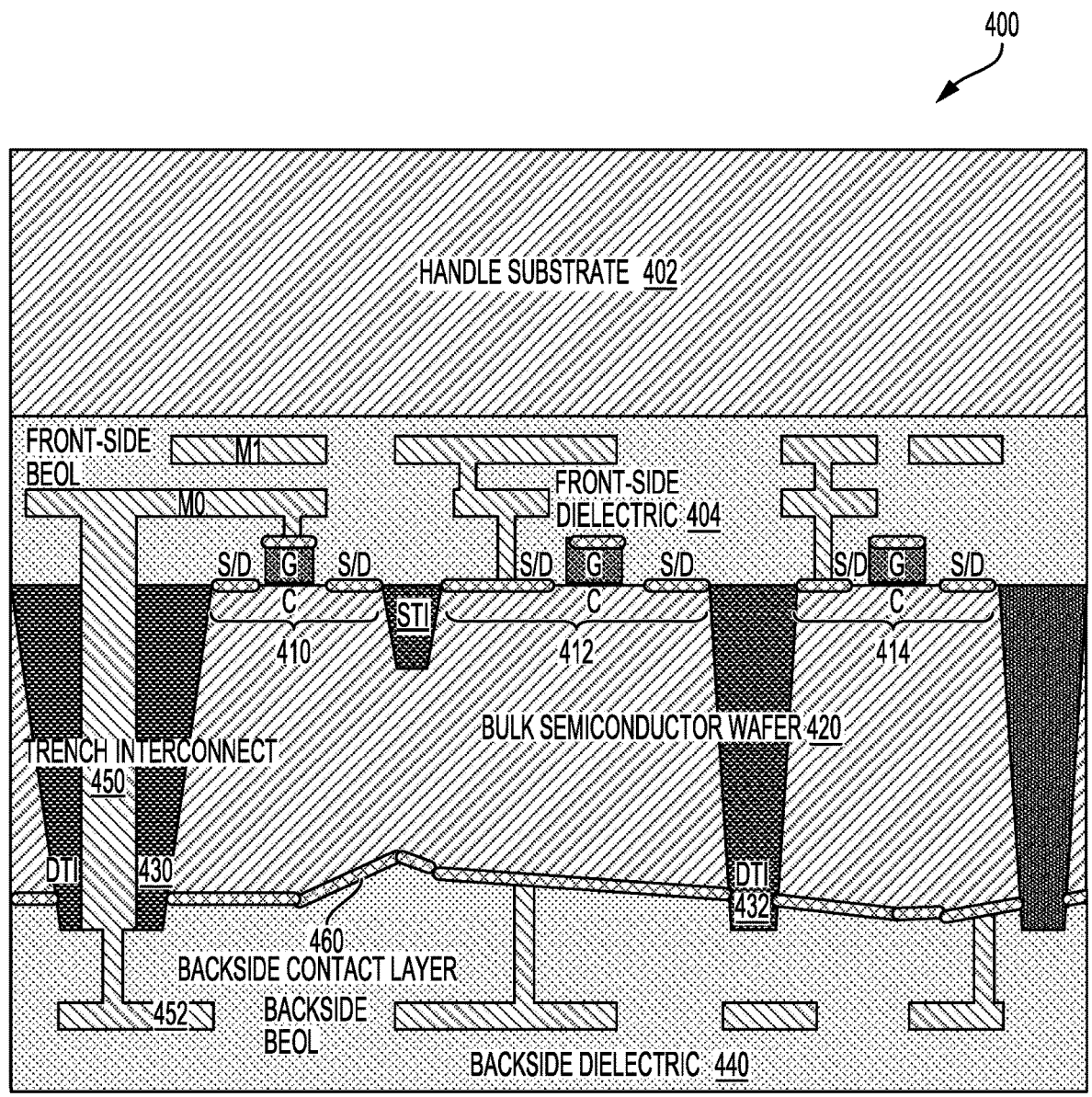
FIG. 4 is a cross-sectional view of a radio frequency integrated circuit (RFIC) having a bulk semiconductor die including a contact layer on a backside of the bulk semiconductor die, according to aspects of the present disclosure.

FIG. 4 is a cross-sectional view of a radio frequency integrated circuit (RFIC) having a bulk semiconductor die including a contact layer on a backside of the bulk semiconductor die, according to aspects of the present disclosure. Representatively, an RF integrated circuit 400 includes a first active device 410, a second active device 412, and a third active device 414, each having a gate (G), source/drain (S/D) regions, and a channel (C) region between the source/drain regions, each formed on a front-side of a bulk semiconductor wafer 420 (e.g., a bulk silicon wafer). In contrast to SOI implementations, an active device layer including the source/drain and channel regions of the active devices (e.g., 410, 412, and 414) is not supported by a buried oxide (BOX) layer.

Although shown as a first active device, it should be recognized that the first active device 410 may be a first active/passive device, as well as a second active/passive device, such as the second active device 412. In addition, although shown as planar devices, it should be recognized that the active devices (e.g., 410, 412, and 414) are not limited to planar devices. For example, the active devices s (e.g., 410, 412, and 414) may include, but are not limited to, planar field effect transistors (FETs), fin-type FETs (Fin-FETs), nanowire FETs, or other like FETs.

The RF integrated circuit 400 also includes MOL interconnects (M0) as well as BEOL interconnects (M1) coupled to the gate as well as the source/drain regions of the active devices (e.g., 410, 412, and 414). The MOL interconnects may include trench interconnects (e.g., CA, CB) and vias (e.g., V0) for coupling active devices formed during a front-end-of-line to metallization layers formed during the back-end-of-line processing. In this example, an MOL interconnect M0 is coupled to a gate contact (e.g., a poly contact) of the gate of the first active device 410 and arranged in a front-side dielectric layer 404. In addition, a handle wafer 402 (handle substrate) is coupled to the front-side dielectric layer 404. A backside dielectric layer 440 is adjacent to and possibly supports the bulk semiconductor wafer 420.

In this configuration, a backside metallization layer (e.g., a second-side metallization layer) is coupled to the front-side MOL zero interconnect M0 through a trench interconnect 450. The trench interconnect 450 extends through a first deep trench isolation (DTI) region 430, from the front-side to the backside of the bulk semiconductor wafer 420. The backside metallization may also be coupled to a backside contact layer 460.

According to aspects of the present disclosure, the first DTI region 430 extends though the backside contact layer 460 and into the backside dielectric layer 440. Similarly, a second deep trench isolation (DTI) region 432 extends though the backside contact layer 460 and into the backside dielectric layer 440. In this example, the backside contact layer 460 is deposited along the backside of the bulk semiconductor wafer 420. The backside contact layer 460 may be composed of a silicide material or other like conductive material. The backside contact layer 460 also contacts a portion of the first DTI region 430 that extends from the backside of the bulk semiconductor wafer 420. In addition, the backside dielectric layer 440 contacts the remaining portion of the first DTI region 430 that extends from the backside of the bulk semiconductor wafer 420.

The layer transfer process shown in FIG. 2 may be used with bulk semiconductor wafers to create CMOS products (e.g., a CMOS transistor) without using expensive SOI substrates, as shown in FIG. 4. Various aspects of the present disclosure provide techniques for bulk layer transfer processing with backside silicidation, as described in FIGS. 5A-5G. One aspect of the present disclosure uses a bulk layer transfer process with backside silicidation (FIG. 6) to form an RF integrated circuit, for example, as shown in FIG. 4.

Figure 5A:
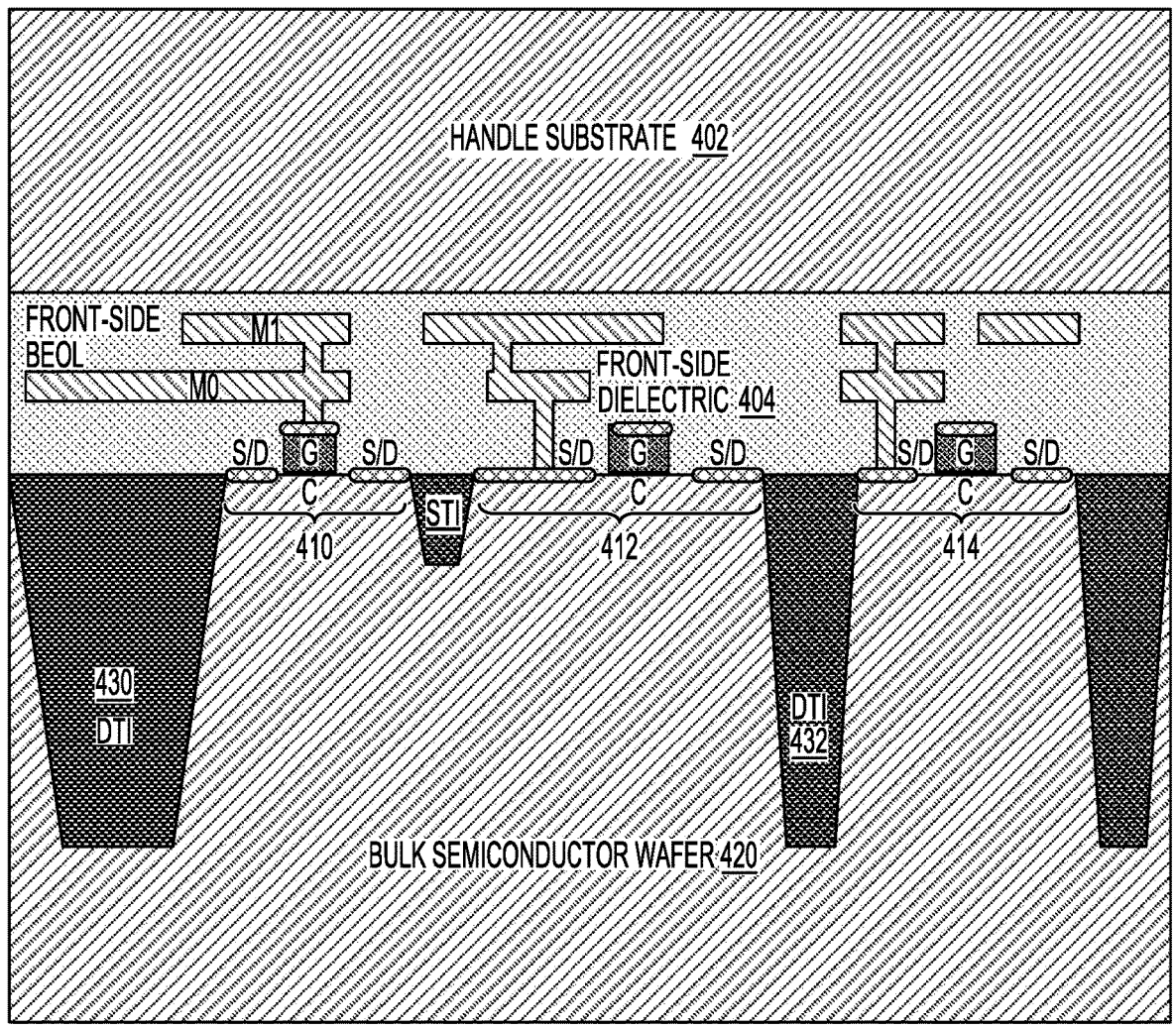
FIGS. 5A-5G illustrate a process for fabricating the RFIC in FIG. 4, according to aspects of the present disclosure.

FIGS. 5A-5G illustrate a process for fabricating the RF integrated circuit 400 of FIG. 4, according to aspects of the present disclosure. FIG. 5A illustrates an initial step for forming the RF integrated circuit 400 of FIG. 4. This process may begin with a complementary metal oxide semiconductor (CMOS) wafer, such as a bulk silicon wafer. Next, CMOS front-end-of-line integration is performed on the bulk semiconductor wafer 420 to form the first active device 410, the second active device 412, and the third active device 414. In this example, the first active device 410 and the second active device 412 are separated by a shallow trench isolation (STI) region. By contrast, the second active device 412 and the third active device 414 are separated by the second DTI region 432. It should be recognized that the first active device 410 and the second active device 412 by be separated by a DTI region to simplify the fabrication process of the RF integrated circuit 400.

According to aspects of the present disclosure, STI regions are used for active device separation, whereas the DTI regions are used for post layer transfer separation. A depth of the first DTI region 430 and the second DTI region 432 may be in the range of 0.4 to 4 micrometers, although the depth of the first DTI region 430 and the second DTI region 432 may be reduced for future processes. The DTI regions as well as the STI regions may be filed with a similar dielectric material, such as silicon dioxide ($SiO_2$) and formed prior to the active devices.

Once the active devices are formed, MOL processes connect the active devices to BEOL interconnect layers. In this example, a zero-layer interconnect M0 is coupled to the gate G of the first active device 410. In addition, a first BEOL interconnect M1 is coupled to the zero-layer interconnect M0. The first BEOL interconnect M1 is formed as part of a front-side BEOL process. This process is followed by depositing the front-side dielectric layer 404. Once the front-side dielectric layer 404 is deposited, the handle wafer 402 is bonded to the front-side dielectric layer 404. The handle wafer 402 can be a processed wafer or a bare wafer.

Figure 5B:
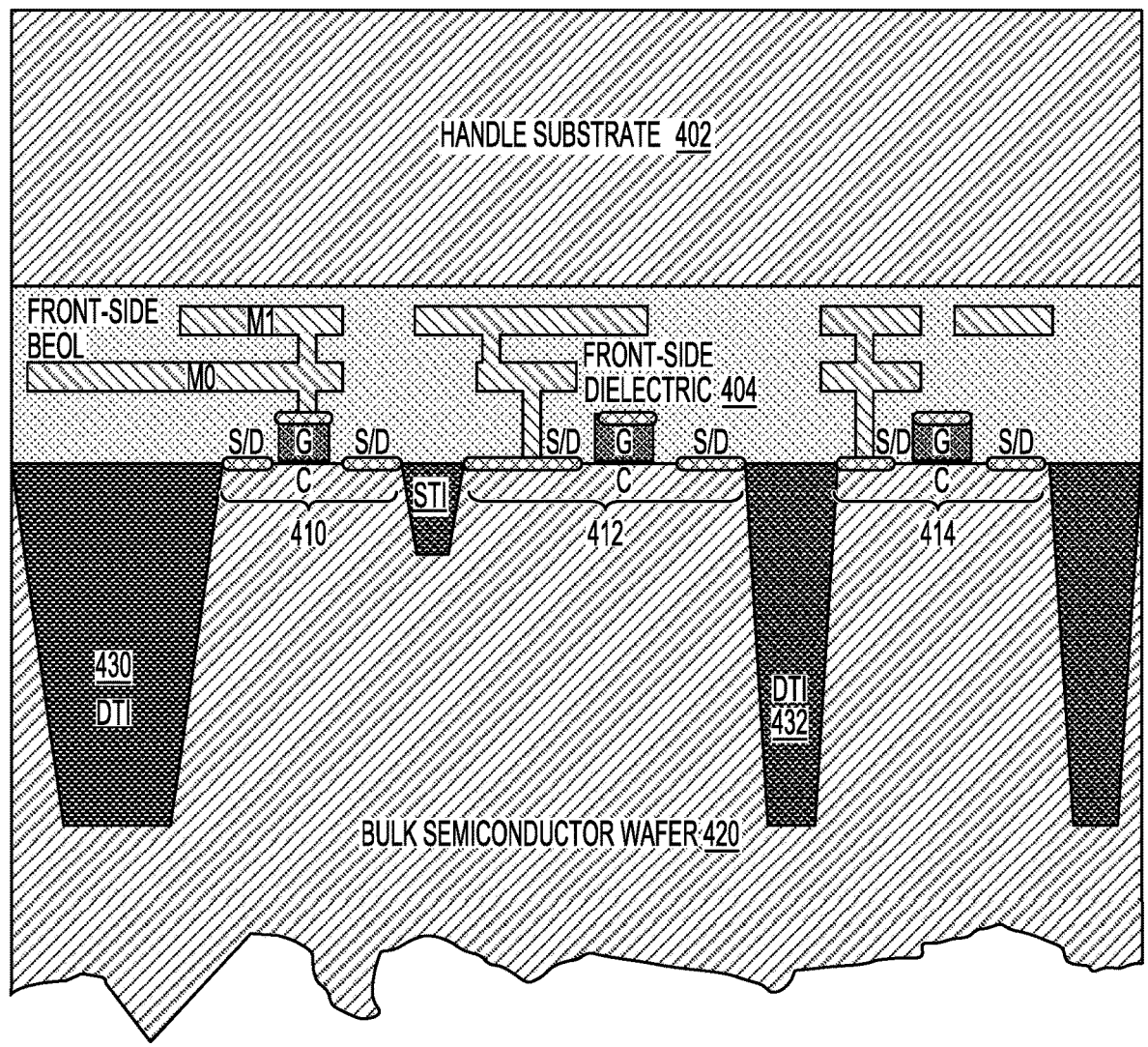

FIG. 5B illustrates a backgrind process of the bulk semiconductor wafer 420. This initial backgrind process is applied to the backside of the bulk semiconductor wafer 420, distal from the active device layer. This initial backgrind process may leave a surface variation of about 5 to 10 micrometers. The backgrind process continues in FIG. 5C, in which a chemical mechanical polish (CMP) process is applied to the backside of the bulk semiconductor wafer 420. This CMP process may reduce the surface variation of the backside of the bulk semiconductor wafer 420 to a range of 0.1 micrometers to 0.4 micrometers, but preferably to 0.1 micrometers. This CMP process does not expose the first DTI region 430 or the second DTI region 432.

Figure 5C:
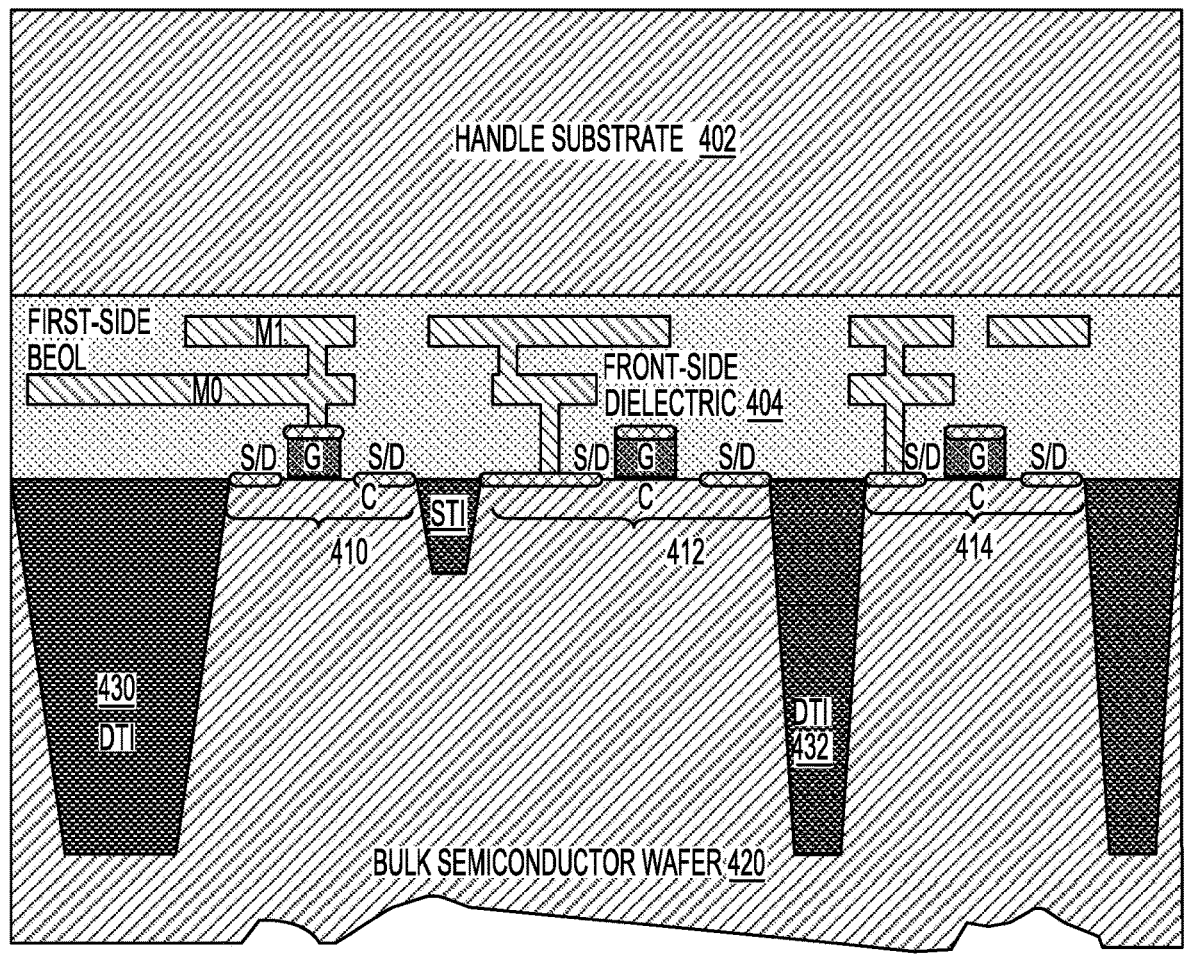

As shown in FIG. 5B, the backgrind process may be applied to the backside of the bulk semiconductor wafer 420 with a surface variation of 5-10 microns. The surface variation may be reduced by polishing the backside of the bulk semiconductor wafer 420 to a predetermined surface variation (e.g., less than 0.3 microns), as shown in FIG. 5C. In addition, a silicon etch (e.g., potassium hydroxide (KOH) or tetramethylammonium hydroxide (TMAH)), a CMP (chemical mechanical polish), or combination of CMP and etching may be performed to reduce a thickness of the bulk semiconductor wafer to a thickness equal to or less than a thickness of the DTI regions.

Figure 5D:
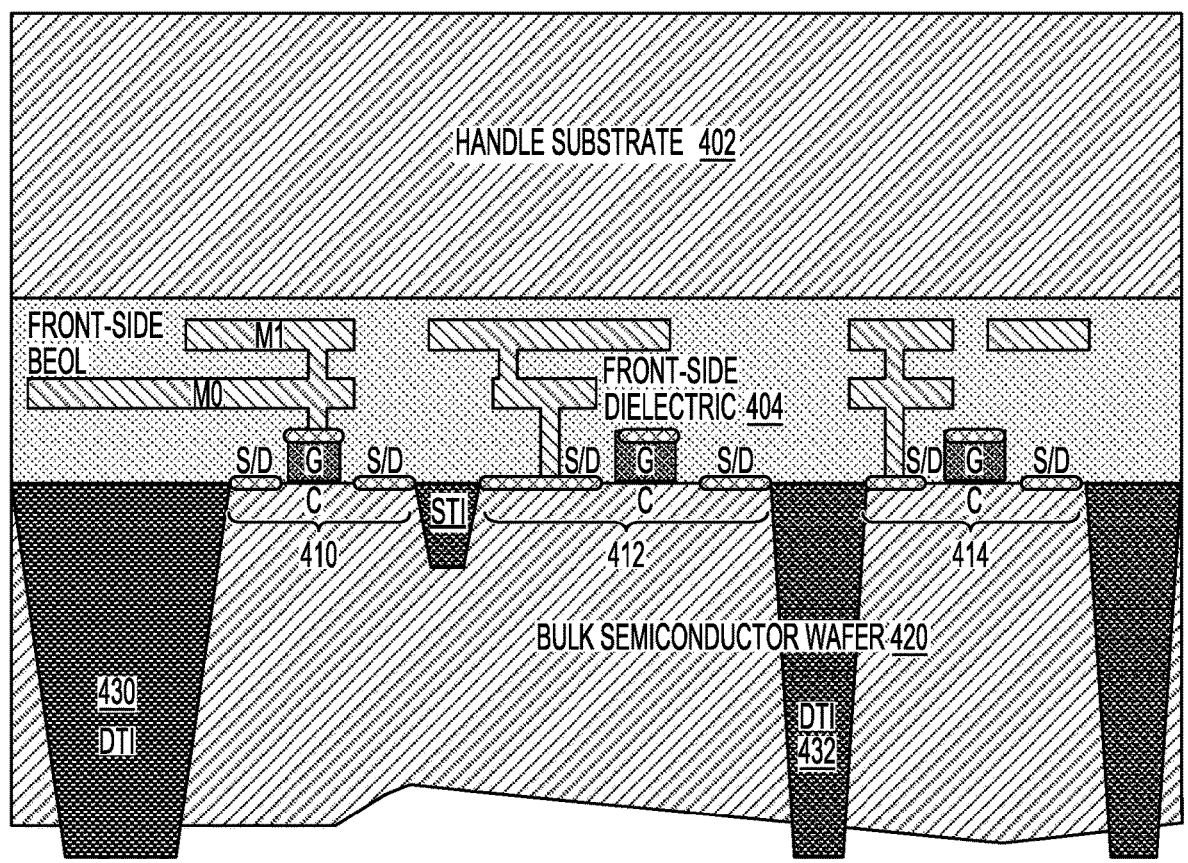

As shown in FIG. 5D, the silicon etch/CMP is performed on the backside of the bulk semiconductor wafer 420 for exposing a portion of the first DTI region 430 as well as the second DTI region 432. In a further aspect of the present disclosure, an etch stop layer may be formed in the bulk semiconductor wafer 420 for improving a planarity of the backside of the bulk semiconductor wafer 420. Once the first DTI region 430 and the second DTI region 432 are exposed, a post-layer transfer silicide layer may be deposited on an entire length of the backside of the bulk semiconductor wafer 420 for forming the backside contact layer 460, which is further described in FIG. 5E.

Figure 5E:
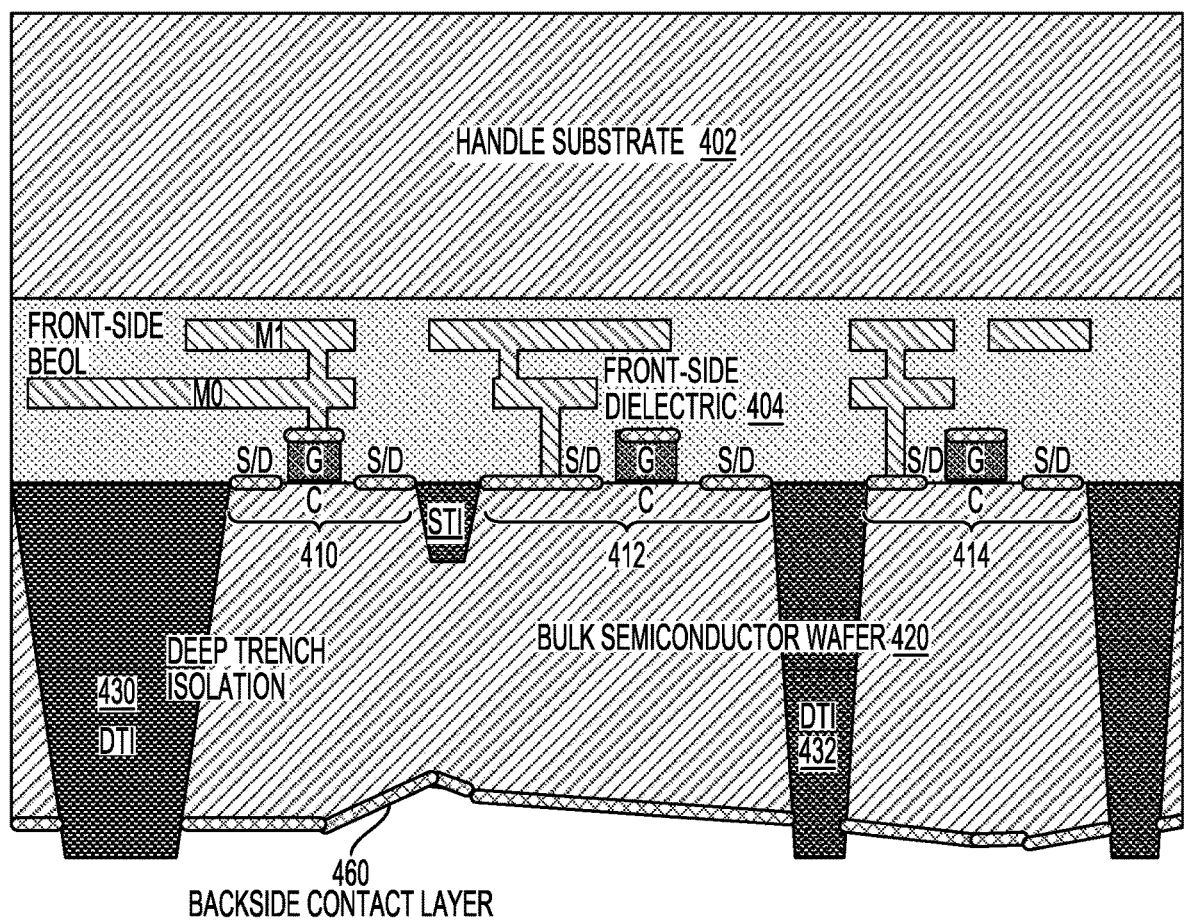
Figure 5F:
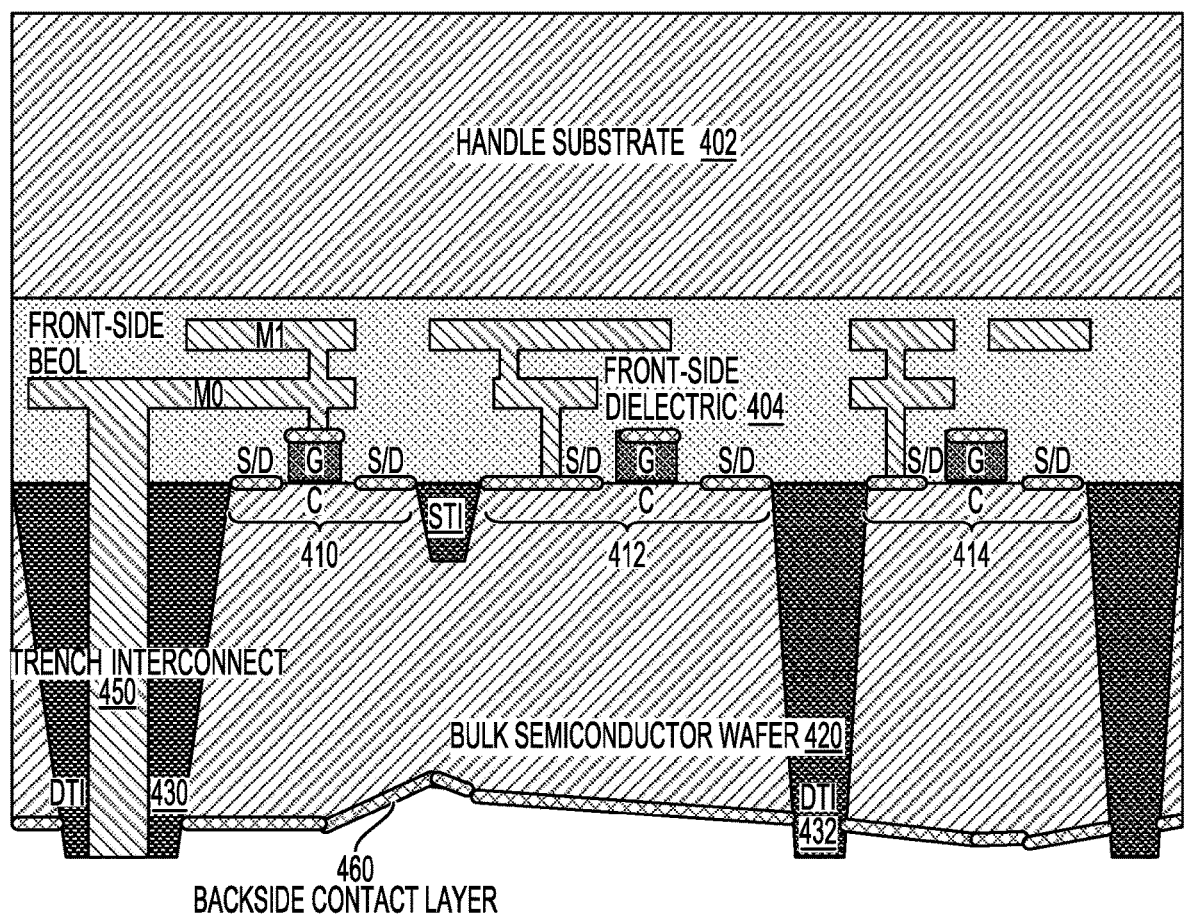
Figure 5G:
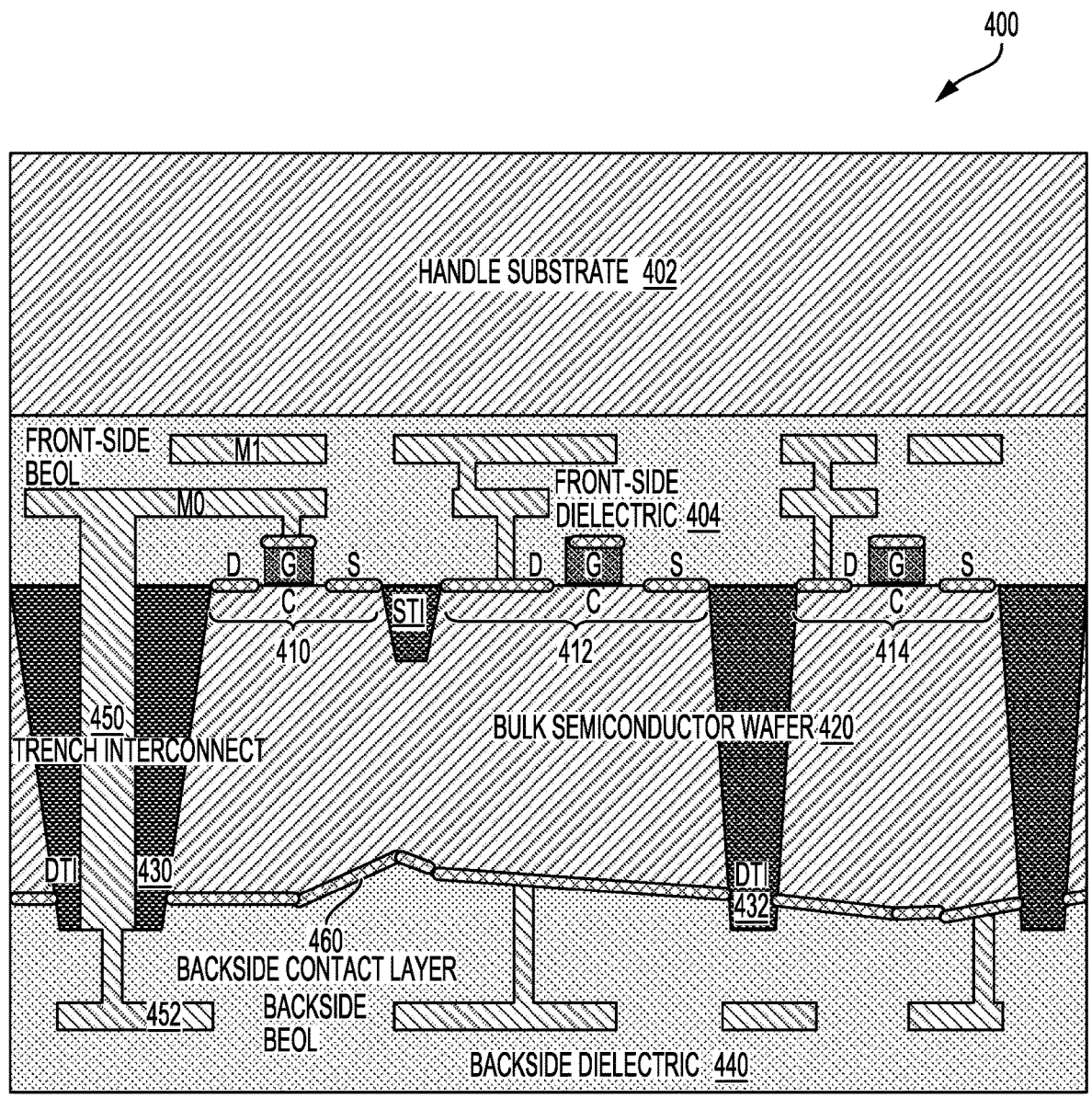

As shown in FIG. 5F a trench interconnect 450 is formed through the first DTI region 430. In this example, the trench interconnect 450 is coupled to the front-side zero interconnect M0 in the front-side dielectric layer 404. As shown in FIG. 5G, the RF integrated circuit 400 is completed by forming a backside BEOL interconnect 452 and depositing the backside dielectric layer 440. The backside dielectric layer 440 is deposited on the backside of the bulk semiconductor wafer 420 and exposed sidewalls of the first DTI region 430 that extend from the backside of the bulk semiconductor wafer 420. In this example, the backside dielectric layer 440 is distal from the front-side dielectric layer 404. In this example, the backside BEOL interconnect 452 is coupled to the front-side zero interconnect M0 through the trench interconnect 450.

Figure 6:
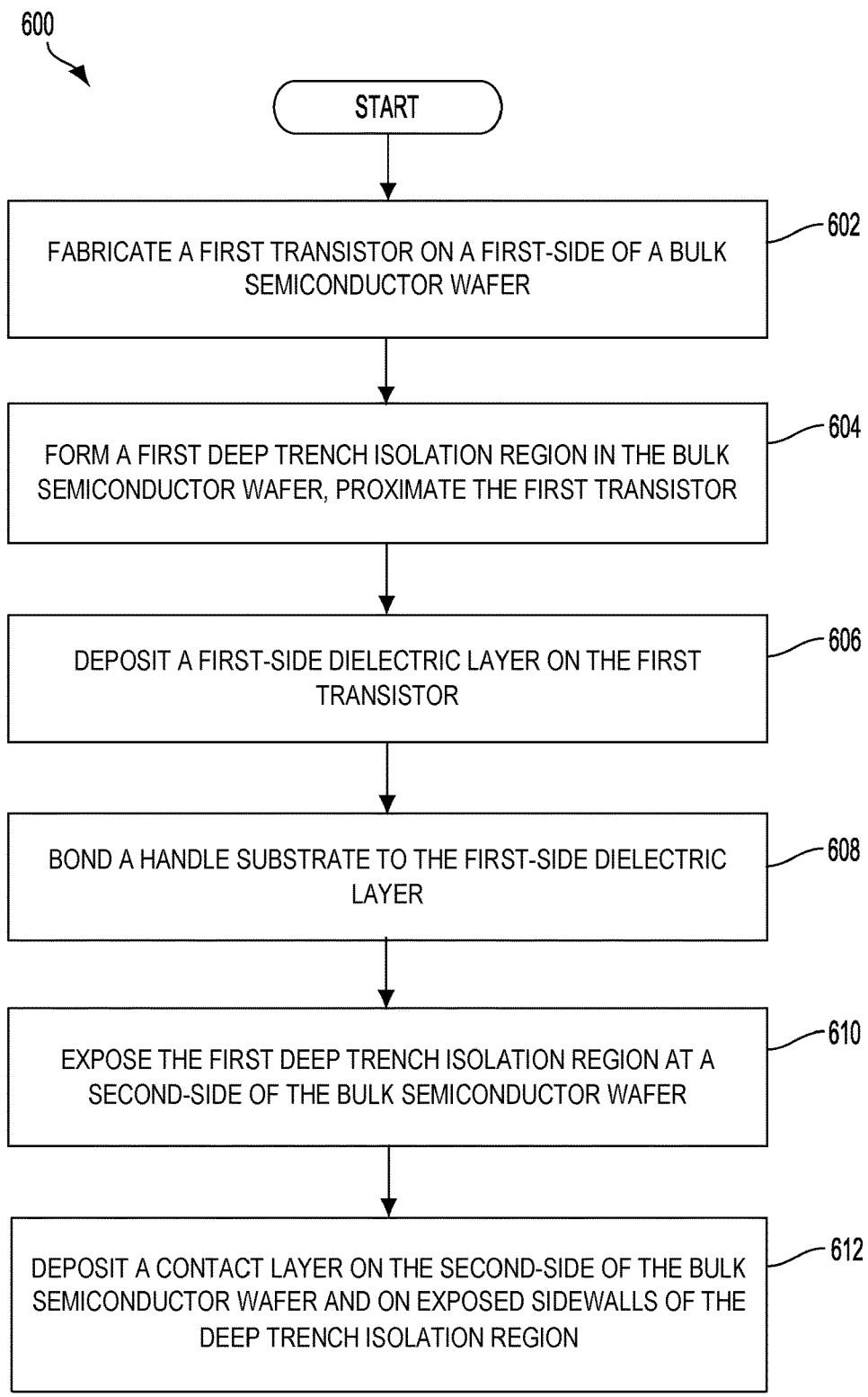
FIG. 6 is a process flow diagram illustrating a method of constructing a radio frequency integrated circuit (RFIC) using a bulk semiconductor layer transfer process according to aspects of the present disclosure.

FIG. 6 is a process flow diagram illustrating a method 600 of a bulk layer transfer process with second-side (e.g., backside) silicidation for constructing a radio frequency integrated circuit (RFIC) according to an aspect of the present disclosure. In block 602, a first transistor is fabricated on a first-side of a bulk semiconductor wafer. For example, as shown in FIG. 4, a first active device 410 is fabricated on a first-side of a bulk semiconductor wafer 420. In block 604, a first deep trench isolation region is formed in the bulk semiconductor wafer, proximate the first transistor. For example, as shown in FIG. 4, the first DTI region 430 extends from the first-side to the second-side of the bulk semiconductor wafer 420.

The method 600 may further include fabricating a second transistor on the first-side of the bulk semiconductor wafer. For example, as shown in FIG. 4, a second active device 412 is fabricated adjacent to the first active device 410. An STI region may be formed on the first-side of the bulk semiconductor wafer 420, between the first active device 410 and the second active device 412, prior to forming the active devices. Next, a second DTI region 432 may be formed, extending from the first-side to the second-side of the bulk semiconductor wafer 420, proximate the second active device 412. For example, as shown FIG. 4, the second DTI region 432 is formed between the second active device 412 and the third active device 414.

Referring again to FIG. 6, in block 606, a first-side dielectric layer is deposited on the first transistor. For example, as shown in FIG. 4, the front-side dielectric layer 404 is deposited on the first active device 410. Referring again to FIG. 6, in block 608, a handle substrate is bonded to the first-side dielectric layer. For example, as shown in FIG. 4, the handle wafer 402 is bonded to the front-side dielectric layer 404. In block 610, the first deep trench isolation region is exposed at a second-side of the bulk semiconductor wafer.

For example, as shown in FIG. 5D, the first DTI region 430 is exposed at a second-side of the bulk semiconductor wafer 420. The exposure of the first DTI region 430 may be performed by backgrinding the second-side of the bulk semiconductor wafer and polishing the second-side of the bulk semiconductor wafer to a predetermined surface variation. Referring again to FIG. 6, In block 612, a contact layer is deposited on the second-side of the bulk semiconductor wafer and on exposed sidewalls of the first deep trench isolation region. For example, as shown in FIG. 5E, the backside contact layer 460 is deposited on the backside of the bulk semiconductor wafer 420 using a backside silicide process.

Aspects of the present disclosure relate to using a bulk semiconductor (e.g., silicon) wafer for replacing SOI wafers. That is, aspects of the present disclosure employ inexpensive semiconductor wafers for forming a semiconductor device layer without the use of an expensive SOI wafer. One aspect of the present disclosure uses a backside silicidation process with layer transfer to form a bulk semiconductor wafer including an active device layer on a first-side and a contact layer on a second-side of the bulk semiconductor wafer. In addition, a post-layer transfer metallization process enables the formation of a second-side metallization coupled to a first-side metallization with a trench interconnect extending through a deep trench isolation region in the bulk semiconductor wafer.

According to a further aspect of the present disclosure, an RF integrated circuit, including a bulk semiconductor die having an active/passive device on a first-side and a deep trench isolation region extending from the first-side to a second-side opposite the first-side of the bulk semiconductor die, is described. The RF integrated circuit includes a first-side dielectric layer on the active/passive device. The RF integrated circuit structure also includes means for handling the RF integrated circuit on the first-side dielectric layer. The handling means may be the handle wafer, shown in FIG. 3. In another aspect of the present disclosure, the aforementioned means may be any module or any apparatus configured to perform the functions recited by the aforementioned means.

Figure 7:
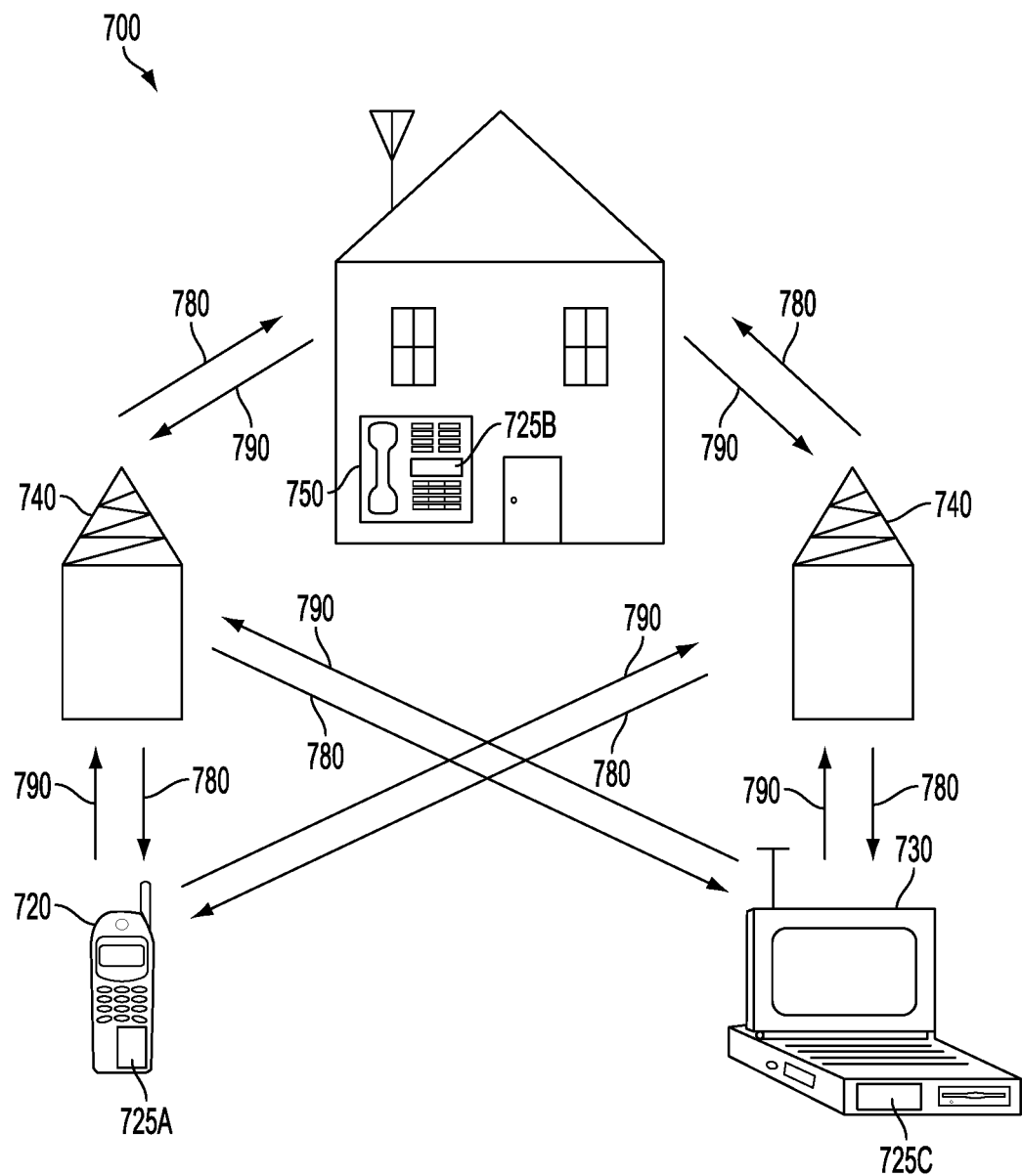
FIG. 7 is a block diagram showing an exemplary wireless communication system in which a configuration of the present disclosure may be advantageously employed.

FIG. 7 is a block diagram showing an exemplary wireless communication system 700 in which an aspect of the present disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B that include the disclosed RFIC. It will be recognized that other devices may also include the disclosed RFIC, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 7 illustrates remote units according to the aspects of the present disclosure, the present disclosure is not limited to these exemplary illustrated units. Aspects of the present disclosure may be suitably employed in many devices, which include the disclosed RFIC.

Figure 8:
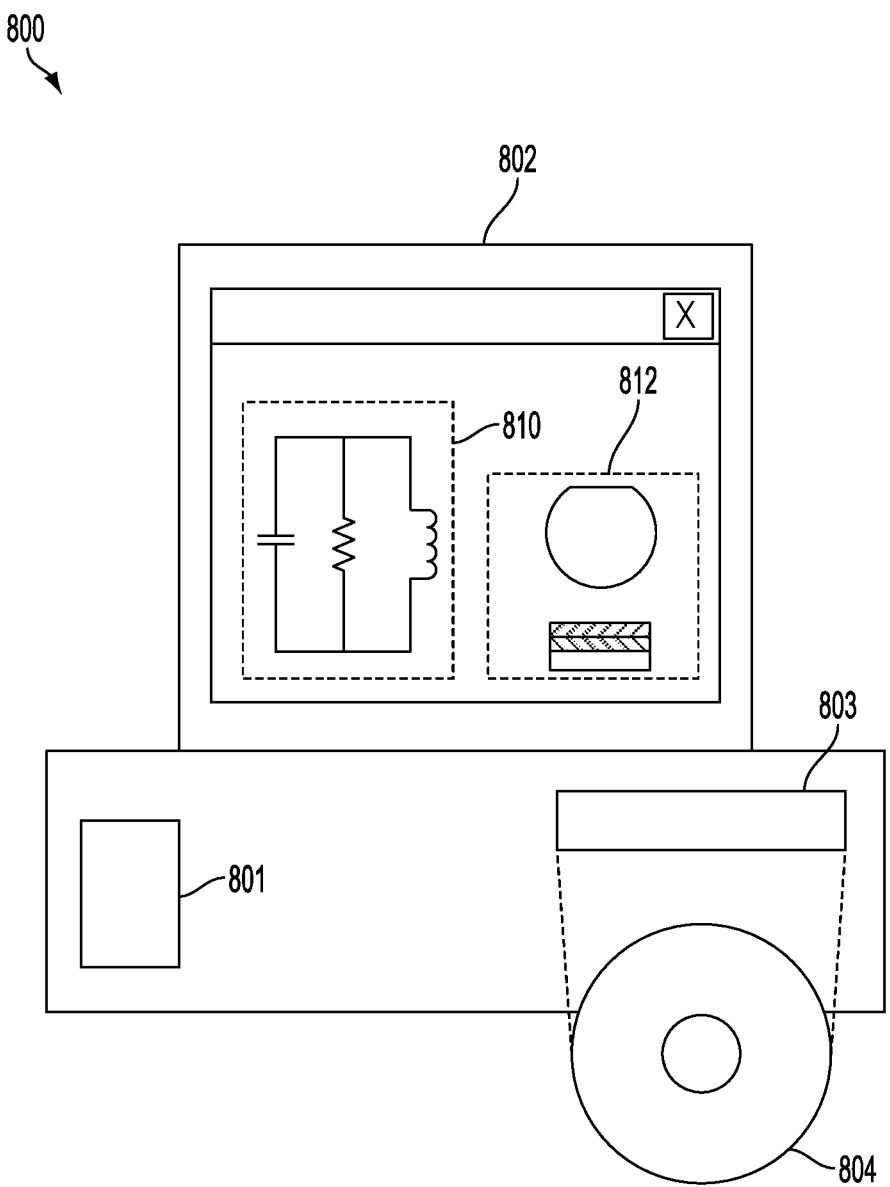
FIG. 8 is a block diagram illustrating a design workstation used for circuit, layout, and logic design of a semiconductor component according to one configuration of the present disclosure.

FIG. 8 is a block diagram illustrating a design workstation used for circuit, layout, and logic design of a semiconductor component, such as the RF devices disclosed above. A design workstation 800 includes a hard disk 801 containing operating system software, support files, and design software such as Cadence or OrCAD. The design workstation 800 also includes a display 802 to facilitate a circuit design 810 or an RFIC design 812. A storage medium 804 is provided for tangibly storing the circuit design 810 or the RFIC design 812. The circuit design 810 or the RFIC design 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the RFIC design 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A radio frequency integrated circuit (RFIC), comprising:
   a bulk semiconductor die comprising a first active/passive device on a first-side of the bulk semiconductor die;
   a first deep trench isolation region extending from the first-side to a second-side opposite the first-side of the bulk semiconductor die;
   a contact layer on the second-side of the bulk semiconductor die;
   a first-side dielectric layer on the first active/passive device;
   a second-side dielectric layer on the contact layer, in which the first deep trench isolation region extends through the contact layer and into the second-side dielectric layer, the second-side dielectric layer being distal from the first-side dielectric layer;
   a trench interconnect extending from the first-side dielectric layer through the first deep trench isolation region and extending into the second-side dielectric layer;
   a first-side metallization layer in the first-side dielectric layer and coupled to the trench interconnect; and
   a second-side metallization layer in the second-side dielectric layer and coupled to the trench interconnect, the second-side metallization layer being distal from the first-side metallization layer.

2. The RFIC of claim 1, further comprising:
   a handle substrate on the first-side dielectric layer.

3. The RFIC of claim 1, further comprising:
   a second active/passive device on the first-side of the bulk semiconductor die;
   a shallow trench isolation (STI) region on the first-side of the bulk semiconductor die, between the first active/passive device and the second active/passive device; and
   a second deep trench isolation (DTI) region extending from the first-side to the second-side of the bulk semiconductor die proximate the second active/passive device.

4. The RFIC of claim 1, in which the contact layer comprises a silicide layer on an entire length of the second-side of the bulk semiconductor die.

5. The RFIC of claim 1, in which the first active/passive device comprises a CMOS transistor.

6. The RFIC of claim 1, integrated into an RF front end module, the RF front end module incorporated into at least one of a music player, a video player, an entertainment unit, a navigation device, a communications device, a personal digital assistant (PDA), a fixed location data unit, a mobile phone, and a portable computer.

7. A radio frequency (RF) front end module, comprising:
   a wireless transceiver, comprising a bulk semiconductor die including a first transistor on a first-side of the bulk semiconductor die, a first deep trench isolation region extending from the first-side to a second-side opposite the first-side of the bulk semiconductor die, a contact layer on the second-side of the bulk semiconductor die, a first-side dielectric layer on the first transistor, a second-side dielectric layer on the contact layer, in which the first deep trench isolation region extends through the contact layer and into the second-side dielectric layer, a trench interconnect extending from the first-side dielectric layer through the first deep trench isolation region and extending into the second-side dielectric layer, a first-side metallization layer in the first-side dielectric layer and coupled to the trench interconnect, and a second-side metallization layer in the second-side dielectric layer and coupled to the trench interconnect, the second-side metallization layer being distal from the first-side metallization layer; and
   an antenna coupled to an output of the wireless transceiver.

8. The RF front end module of claim 7, in which the wireless transceiver further comprises:
- a second transistor on the first-side of the bulk semiconductor die;
- a shallow trench isolation (STI) region on the first-side of the bulk semiconductor die, between the first transistor and the second transistor; and
- a second deep trench isolation (DTI) region extending from the first-side to the second-side of the bulk semiconductor die proximate the second transistor.

9. The RF front end module of claim 7, in which the wireless transceiver further comprises:
- a handle substrate on the first-side dielectric layer.

10. The RF front end module of claim 7, incorporated into at least one of a music player, a video player, an entertainment unit, a navigation device, a communications device, a personal digital assistant (PDA), a fixed location data unit, a mobile phone, and a portable computer.

* * * * *